US008471986B2

(12) United States Patent
Katayama et al.

(10) Patent No.: US 8,471,986 B2
(45) Date of Patent: Jun. 25, 2013

(54) ELECTRO-OPTICAL DEVICE AND ELECTRONIC APPARATUS COMPRISING AN ADDRESS LINE

(75) Inventors: Shigenori Katayama, Suwa (JP); Takashi Toya, Gifu (JP)

(73) Assignee: Japan Display West Inc., Aichi-Ken (JP)

(*) Notice: Subject to any disclaimer, the term of this patent is extended or adjusted under 35 U.S.C. 154(b) by 402 days.

(21) Appl. No.: 11/514,210

(22) Filed: Sep. 1, 2006

(65) Prior Publication Data

US 2007/0070006 A1 Mar. 29, 2007

(30) Foreign Application Priority Data

Sep. 28, 2005 (JP) ................................ 2005-281398

(51) Int. Cl.

| | |
|---|---|
| ***G02F 1/1335*** | (2006.01) |
| ***G02F 1/1343*** | (2006.01) |
| ***G09G 3/36*** | (2006.01) |
| ***H01L 29/04*** | (2006.01) |
| ***H01L 29/10*** | (2006.01) |
| ***H01L 31/00*** | (2006.01) |
| ***H01L 27/14*** | (2006.01) |
| ***H01L 29/15*** | (2006.01) |
| ***H01L 31/036*** | (2006.01) |

(52) U.S. Cl.

USPC ............... 349/106; 349/139; 345/88; 257/59; 257/72

(58) Field of Classification Search

USPC .................. 349/106–111, 48, 73, 49, 77–80, 349/83, 139, 149; 345/88; 257/59, 72

See application file for complete search history.

(56) References Cited

U.S. PATENT DOCUMENTS

| | | | | |
|---|---|---|---|---|
| 4,396,251 | A * | 8/1983 | Mukoh et al. | 349/106 |
| 5,311,337 | A * | 5/1994 | McCartney, Jr. | 349/109 |
| 5,796,378 | A * | 8/1998 | Yoshida et al. | 349/78 |
| 6,111,622 | A * | 8/2000 | Abileah | 349/106 |
| 6,122,027 | A * | 9/2000 | Ogawa et al. | 349/106 |
| 6,326,981 | B1 * | 12/2001 | Mori et al. | 345/695 |
| 6,636,194 | B2 | 10/2003 | Ishii | |
| 6,703,996 | B2 * | 3/2004 | Janssen et al. | 345/92 |
| 6,873,320 | B2 * | 3/2005 | Nakamura | 345/204 |
| 7,023,500 | B2 * | 4/2006 | Kikuchi et al. | 349/43 |
| 2003/0160915 | A1 * | 8/2003 | Liu | 349/106 |
| 2005/0134785 | A1 * | 6/2005 | Roth et al. | 349/144 |

FOREIGN PATENT DOCUMENTS

| | | |
|---|---|---|
| JP | A-8-194205 | 7/1996 |
| JP | A 08-286170 | 11/1996 |
| JP | A-2001-343636 | 12/2001 |
| JP | A 2002-175040 | 6/2002 |
| JP | B2 3428593 | 5/2003 |
| WO | WO 00/08625 A1 | 2/2000 |

* cited by examiner

*Primary Examiner* — Lucy Chien
*Assistant Examiner* — Paisley L Arendt
(74) *Attorney, Agent, or Firm* — K&L Gates LLP

(57) ABSTRACT

An electro-optical device that includes scanning lines, data lines intersecting the corresponding scanning lines, pixels disposed at the intersections of the corresponding scanning lines and data lines, the pixels include color filters, and an address line that specifies a portion to be selected by the corresponding scanning line, the address line includes an address main line extending along the data lines and an address branch line extending from the address main line along the scanning lines. Among the pixels, pixels adjacent to each other across the address main line are set to be specific pixel groups, and among at least two of the specific pixel groups, the color arrangement of the color filters of one specific pixel group is different from the color arrangement of the color filters of another specific pixel group.

13 Claims, 8 Drawing Sheets

ELECTRO-OPTICAL DEVICE AND ELECTRONIC APPARATUS COMPRISING AN ADDRESS LINE

BACKGROUND

1. Technical Field

The present invention relates to electro-optical devices and electronic apparatuses.

2. Related Art

Electro-optical devices, such as liquid crystal devices that display images by utilizing liquid crystal, are known. Such a liquid crystal device includes a liquid crystal panel and backlight, which serves as an illumination device. The liquid crystal panel includes a display area having a plurality of pixels, a scanning line drive circuit, and a data line drive circuit. The scanning line drive circuit and the data line drive circuit are disposed around the display area to drive the pixels. The plurality of pixels include three types of pixels, i.e., pixels having a red (R) color filter, pixels having a green (G) color filter, and pixels having a blue (B) color filter.

The liquid crystal panel includes an element substrate on which thin-film transistors (TFTs), which serve as switching elements, are disposed in association with the pixels, a counter substrate disposed opposedly facing the element substrate, and liquid crystal, which serves as an electro-optical material, held between the element substrate and the counter substrate.

The element substrate includes a plurality of scanning lines disposed at regular intervals, a plurality of data lines disposed at regular intervals and crossing substantially at right angles with the corresponding scanning lines, and TFTs and pixel electrodes disposed at the intersections between the corresponding scanning lines and the corresponding data lines. The counter substrate includes counter electrodes disposed opposedly facing the pixel electrodes.

Each pixel includes a storage capacitor in addition to the above-described TFT, pixel electrode, and counter electrode. The scanning lines are connected to the gates of the corresponding TFTS, the data lines are connected to the sources of the corresponding TFTS, and the pixel electrodes and the storage capacitors are connected to the drains of the corresponding TFTS.

The liquid crystal device configured as described above operates as follows. The scanning line drive circuit line-sequentially supplies a selection voltage to the scanning lines one by one so that all the pixels of a certain scanning line are selected. In synchronization with the selection of the pixels, the data line drive circuit supplies image signals to the data lines. With this operation, an image signal is supplied from the data line via the switching element to the pixel selected by the scanning line drive circuit and the data line drive circuit so that image data can be written into the pixel electrode.

When the image data is written into the pixel electrode, a drive voltage is applied to the liquid crystal due to the potential difference of the voltage applied to the pixel electrode and the counter electrode. By varying the voltage level of the image signal, the orientation and order of the liquid crystal are changed so that grayscale display is implemented by light modulation of the individual pixels. Because of the provision of the storage capacitors, the drive voltage applied to the liquid crystal is held over a period longer than the period for which the image data is written into the pixel electrodes by three orders of magnitude.

There is an increasing demand for saving power of electro-optical devices. To address such a demand, an electro-optical device in which address lines that specify areas to be selected by scanning lines are disposed substantially parallel with data lines has been proposed (see Japanese Patent No. 3428593).

In the electro-optical device disclosed in the above publication, areas to be selected by the scanning lines are specified by the address lines. Accordingly, an image signal can be supplied only to the pixels in a selected area, thereby implementing power saving. For example, when the movement of a cursor in a still image is displayed, an area including pixels representing the moving cursor is specified by the corresponding address line. Then, for the pixels representing the moving cursor, i.e., the pixels forming an area of a display image to be changed, an image signal is supplied to each frame. Conversely, for the pixels representing the still image, i.e., the pixels forming an area of the display image to remain unchanged, an image signal is supplied to every other frame. In this case, power can be saved more efficiently than the case where an image signal is supplied to all pixels of each frame.

In the above-described electro-optical device, three types of pixels periodically disposed are grouped into one block, and an address line is provided at the boundary of adjacent blocks. Accordingly, the gap between adjacent pixels across an address line is larger than the gap between adjacent pixels without an address line.

The address lines are provided between two specific types of pixels of the three types of pixels. For example, if one block is composed of three types of pixels, i.e., R, G, and B pixels, disposed in that order, an address line is provided between an R pixel and a B pixel.

Thus, since the address lines are provided between the two specific types of pixels among the three types of pixels, the gap between the two specific types of pixels is larger than the gap between other adjacent pixels. Accordingly, pixels forming a display image concentrate on the two specific types of pixels, and as a result, special stripe or spot-like patterns appear, thereby decreasing the image quality.

SUMMARY

An advantage of the invention is that it provides an electro-optical device and an electronic apparatus that can improve the image quality while implementing power saving.

According to an aspect of the invention, there is provided an electro-optical device including a plurality of scanning lines, a plurality of data lines intersecting with the corresponding plurality of scanning lines, a plurality of pixels disposed at intersections of the corresponding plurality of scanning lines and the corresponding plurality of data lines, the plurality of pixels including a plurality of types of color filters, and an address line that specifies a portion to be selected by the corresponding scanning line, the address line including an address main line extending along the plurality of data lines and an address branch line extending from the address main line along the plurality of scanning lines. Among the plurality of pixels, pixels adjacent to each other across the address main line are set to be specific pixel groups, and among at least two of the specific pixel groups, the color arrangement of the color filters of one specific pixel group is different from the color arrangement of the color filters of another specific pixel group.

With this configuration, the address line that specifies a portion to be selected by the scanning line includes the address main line and the address branch line. Accordingly, the portion to form a display image to be changed can be specified by the address line, thereby implementing power saving.

Among at least two specific pixel groups, the color arrangement of the color filters of one specific pixel group is different from the color arrangement of the color filters of another specific pixel group. Accordingly, it is possible to suppress the concentration of specific types of pixels in a display image. As a result, the appearance of special stripe or spot-like patterns can be suppressed, and the image quality can be improved.

It is preferable that the number of the types of color filters and the number of pixels disposed in a portion specified by the address main line and disposed in a direction intersecting with the address main line may be relatively prime. If two numbers are relatively prime, the greatest common measure of the two numbers is 1.

The appearance cycle of the specific pixel groups having the same color arrangement of the color filters is the least common multiple of the number of types of color filters and the number of pixels disposed in a portion specified by the address main line and disposed in a direction intersecting with the address main line.

Accordingly, the number of types of color filters and the number of pixels disposed in a portion specified by the address main line and disposed in a direction intersecting with the address main line are set to be relatively prime. With this arrangement, the appearance cycle of the specific pixel groups having the same color arrangement of the color filters is long, thereby further suppressing the concentration of specific types of pixels in a display image.

According to another aspect of the invention, there is provided an electronic apparatus including the aforementioned electro-optical device. In this case, advantages similar to those obtained by the aforementioned electro-optical device can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
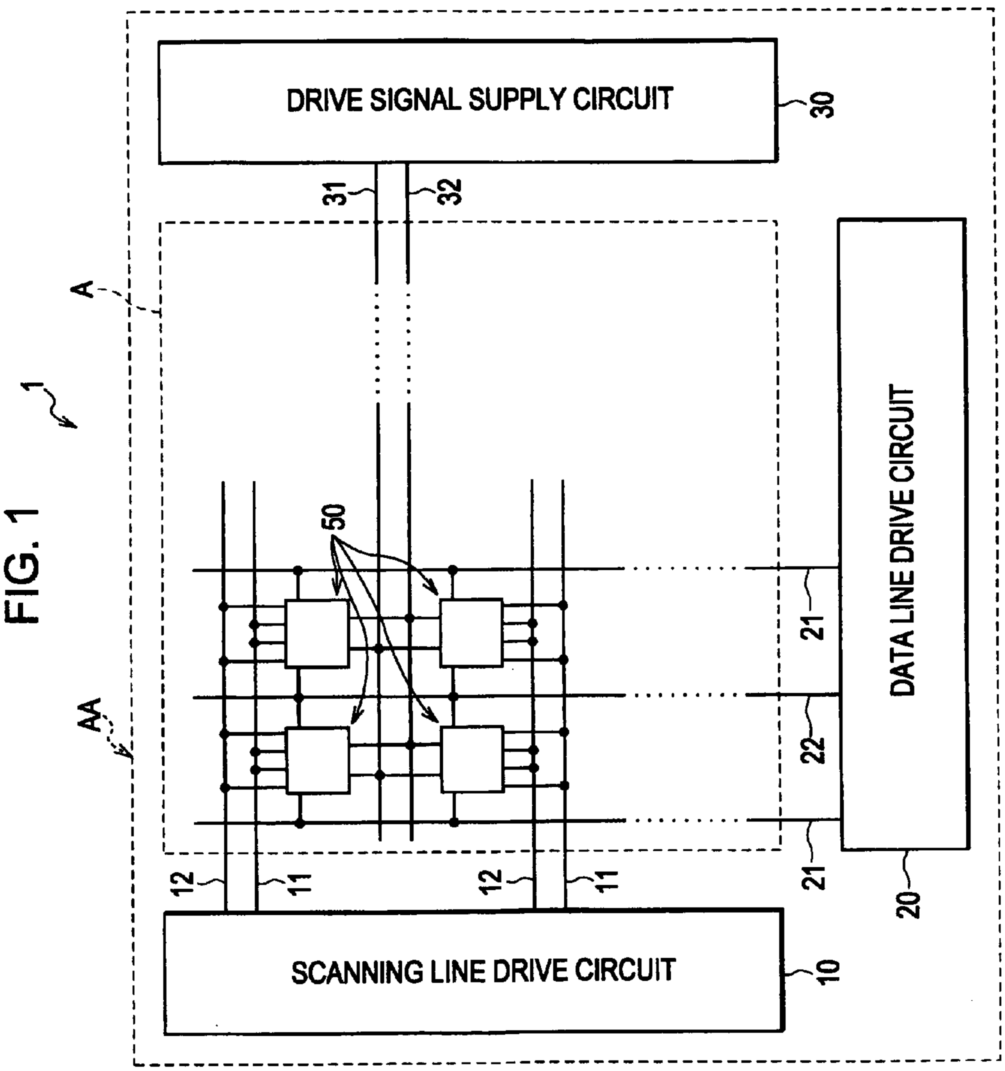
FIG. 1 is a block diagram illustrating the configuration of an electro-optical device according to an embodiment of the invention.

An embodiment of the invention is described below with reference to the accompanying drawings. In the following embodiment and modified examples, like elements are designated with like reference numerals, and an explanation thereof is thus omitted or simplified.

Embodiments

FIG. 1 is a block diagram illustrating the configuration of an electro-optical device 1 according to an embodiment of the invention. The electro-optical device 1 includes a liquid crystal panel AA.

The liquid crystal panel AA includes a display area A having a plurality of pixels 50, a scanning line drive circuit 10, a data line drive circuit 20, and a drive signal supply circuit 30, which are disposed around the display area A to drive the pixels 50.

On the liquid crystal panel AA, a pair of wiring patterns, such as an address line 11 and a scanning line 12, extending in the horizontal direction (X direction) in FIG. 1, and a pair of wiring patterns, such as a first drive line 31 and a second drive line 32, extending in the horizontal direction (X direction) in FIG. 1, are alternately disposed at regular intervals. First data lines 21 and second data lines 22 extending in the vertical direction (Y direction) in FIG. 1 are alternately disposed at regular intervals while intersecting with the address lines 11, the scanning lines 12, the first drive lines 31, and the second drive lines 32.

Pixels 50 are disposed at the intersections between the corresponding address lines 11 and scanning lines 12 or the first drive lines 31 and the second drive lines 32 and the first data lines 21 or the second data lines 22.

The scanning line drive circuit 10 supplies an X signal (address signal) specifying an area to be selected by the scanning line 12 to each address line 11, and also line-sequentially supplies Y signals (scanning signals) selecting the pixels 50 to the scanning lines 12. With this operation, from among a plurality of portions divided from the display area A in the X direction and in the Y direction, a portion divided in the X direction is selected by the X signal (address signal), and a portion divided in the Y direction is selected by the Y signal (scanning signal).

The data line drive circuit 20 supplies an image signal to each first data line 21 and also supplies an inverted image signal generated by inverting the image signal supplied to each first data line 21 to the corresponding second data line 22.

The drive signal supply circuit 30 supplies an alternating current (AC) drive signal to each first drive line 31 and also supplies an inverted drive signal generated by inverting the AC drive signal to each second drive line 32.

Figure 2:
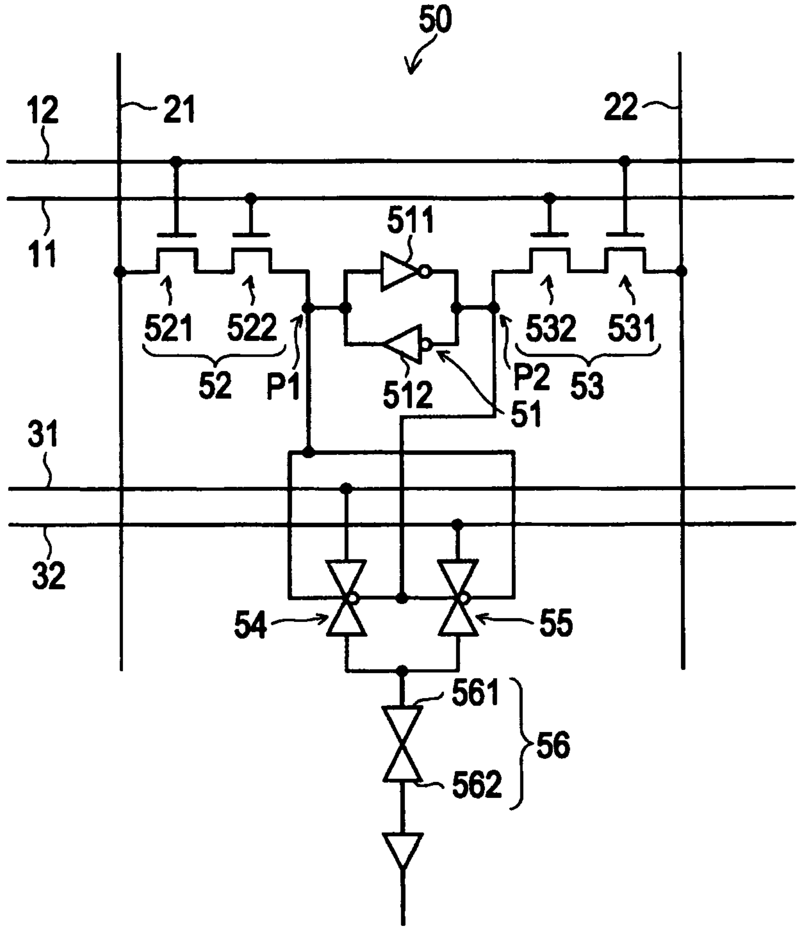
FIG. 2 is a circuit diagram illustrating the transistors of a pixel forming the electro-optical device.
Figure 3:
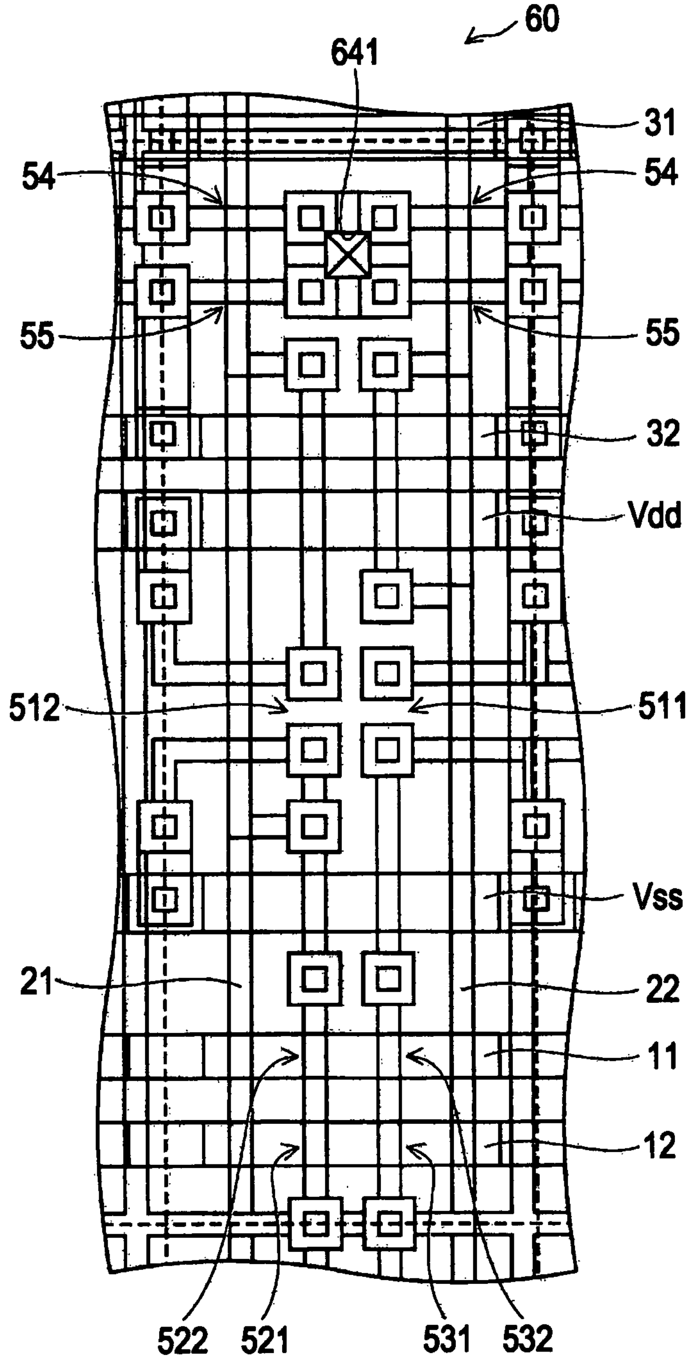
FIG. 3 is an enlarged, plan view illustrating a liquid crystal panel of the electro-optical device.

FIG. 2 is a circuit diagram illustrating the transistors of the pixel 50. FIG. 3 is an enlarged, plan view illustrating the liquid crystal panel AA.

The pixel 50 includes a memory cell 51, a first switching circuit 52, a second switching circuit 53, a first transfer gate 54, a second transfer gate 55, and a liquid crystal cell 56.

The memory cell 51 is formed of two inverters 511 and 512 loop-connected to each other. That is, the input terminal of the inverter 511 is connected to the output terminal of the inverter 512, and the output terminal of the inverter 511 is connected to the input terminal of the inverter 512. In the memory cell 51, the input terminal of the inverter 511 or the output terminal of the inverter 512 is used as a terminal P1, while the output terminal of the inverter 511 or the input terminal of the inverter 512 is used as a terminal P2.

The first switching circuit 52 supplies an image signal output from the first data line 21 to the terminal P1 of the memory cell 51 in accordance with the X signal (address signal) from the address line 11 and the Y signal (scanning signal) from the scanning line 12.

More specifically, in the first switching circuit 52, an n-MOS TFT 521 to be turned ON or OFF in accordance with the Y signal (scanning signal) and an n-MOS TFT 522 to be turned ON or OFF in accordance with the X signal (address signal) are connected in series with each other.

The gate of the TFT 521 is connected to the scanning line 12 and the source of the TFT 521 is connected to the first data line 21. The gate of the TFT 522 is connected to the address line 11, the source of the TFT 522 is connected to the drain of the TFT 521, and the drain of the TFT 522 is connected to the terminal P1 of the memory cell 51.

The second switching circuit 53 supplies an inverted image signal output from the second data line 22 to the terminal P2 of the memory cell 51 in accordance with the X signal (address signal) from the address line 11 and the Y signal (scanning signal) from the scanning line 12.

More specifically, in the second switching circuit 53, an n-MOS TFT 531 to be turned ON or OFF in accordance with the Y signal (scanning signal) and an n-MOS TFT 532 to be turned ON or OFF in accordance with the X signal (address signal) are connected in series with each other.

The gate of the TFT 531 is connected to the scanning line 12 and the source of the TFT 531 is connected to the second data line 22. The gate of the TFT 532 is connected to the address line 11, the source of the TFT 532 is connected to the drain of the TFT 531, and the drain of the TFT 532 is connected to the terminal P2 of the memory cell 51.

The liquid crystal cell 56 includes a pixel electrode 561, a counter electrode 562 disposed opposite the pixel electrode 561, and a liquid crystal layer held between the pixel electrode 561 and the counter electrode 562.

The first transfer gate 54 has a complementary MOS (CMOS) structure, and supplies a drive signal from the first drive line 31 to the pixel electrode 561 of the liquid crystal cell 56 in accordance with a control signal from the memory cell 51. More specifically, in the first transfer gate 54, the control terminal is connected to the terminals P1 and P2 of the memory cell 51, the input terminal is connected to the first drive line 31, and the output terminal is connected to the pixel electrode 561.

The second transfer gate 55 has a CMOS structure, and supplies an inverted drive signal from the second drive line 32 to the pixel electrode 561 of the liquid crystal cell 56 in accordance with a control signal from the memory cell 51. More specifically, in the second transfer gate 55, the control terminal is connected to the terminals P1 and P2 of the memory cell 51, the input terminal is connected to the second drive line 32, and the output terminal is connected to the pixel electrode 561.

The above-configured electro-optical device 1 is operated as follows.

The scanning line drive circuit 10 supplies the X signal (address signal) to each address line 11 to specify a portion of the display area A, and also line-sequentially supplies the Y signal (scanning signal) to the scanning lines 12 one by one.

Then, the TFTs 522 and 532 of the pixels 50 disposed in the specified portion of the display area A are turned ON by the X signal (address signal), and the TFTs 521 and 531 of the pixels 50 disposed in the selected scanning line are turned ON by the Y signal (scanning signal). With this operation, all pixels 50 included in the specified portion are selected from among the pixels 50 disposed in the selected scanning line 12.

In synchronization with the selection of the pixels 50, the data line drive circuit 20 supplies an image signal to the first data line 21 and an inverted image signal to the second data line 22. Then, the image signal and the inverted image signal are written into the memory cells 51 of the selected pixels 50 and are also supplied to the control terminals of the first and second transfer gates 54 and 55.

Accordingly, the first transfer gate 54 or the second transfer gate 55 is selectively turned ON so that the drive signal from the first drive line 31 or the inverted drive signal from the second drive line 32 is written into the pixel electrode 561.

When the image signal or the inverted image signal is written into the pixel electrode 561, a drive voltage is applied to the liquid crystal due to the potential difference between the pixel electrode 561 and the counter electrode 562. Accordingly, the orientation and order of the liquid crystal are changed so that grayscale display is implemented by light modulation of the pixels 50. The image signal and the inverted image signal supplied to the memory cell 51 are retained by the memory cell 51, and accordingly, the drive voltage applied to the liquid crystal is also retained until an image signal and an inverted image signal are written into the subsequent frame.

According to the electro-optical device 1, not only a full-screen display mode in which an image is displayed in the entire display area A, but also a partial display mode in which an image is displayed in only part of the display area, can be implemented. In the partial display mode, from among a plurality of portions divided from the display area A, a portion can be specified by the X signal (address signal) and the Y signal (scanning signal), and an image is displayed only in the specified portion. Thus, power saving can be achieved in the partial display mode.

Figure 4:
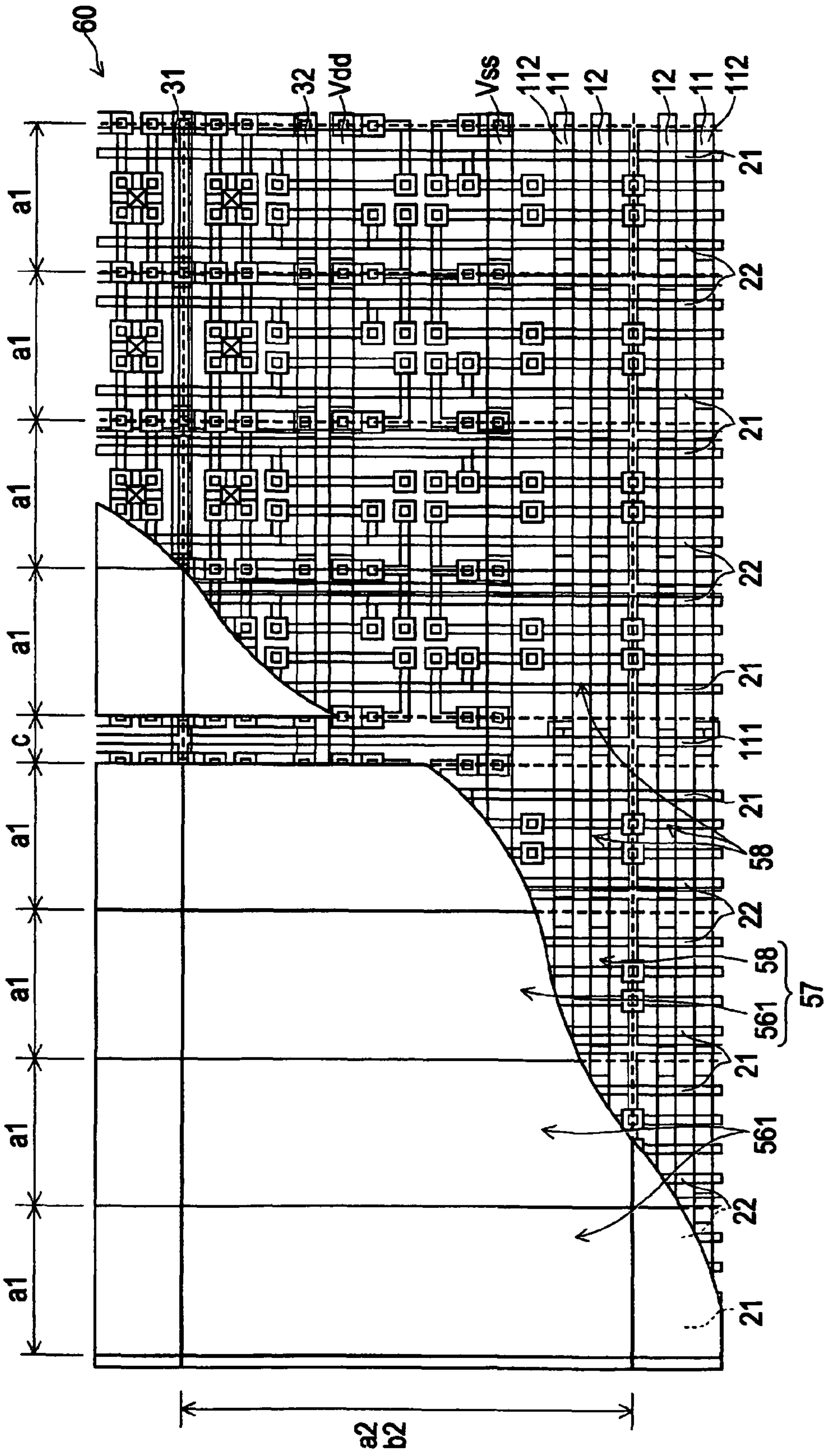
FIG. 4 is a plan view illustrating the liquid crystal panel of the electro-optical device.
Figure 5:
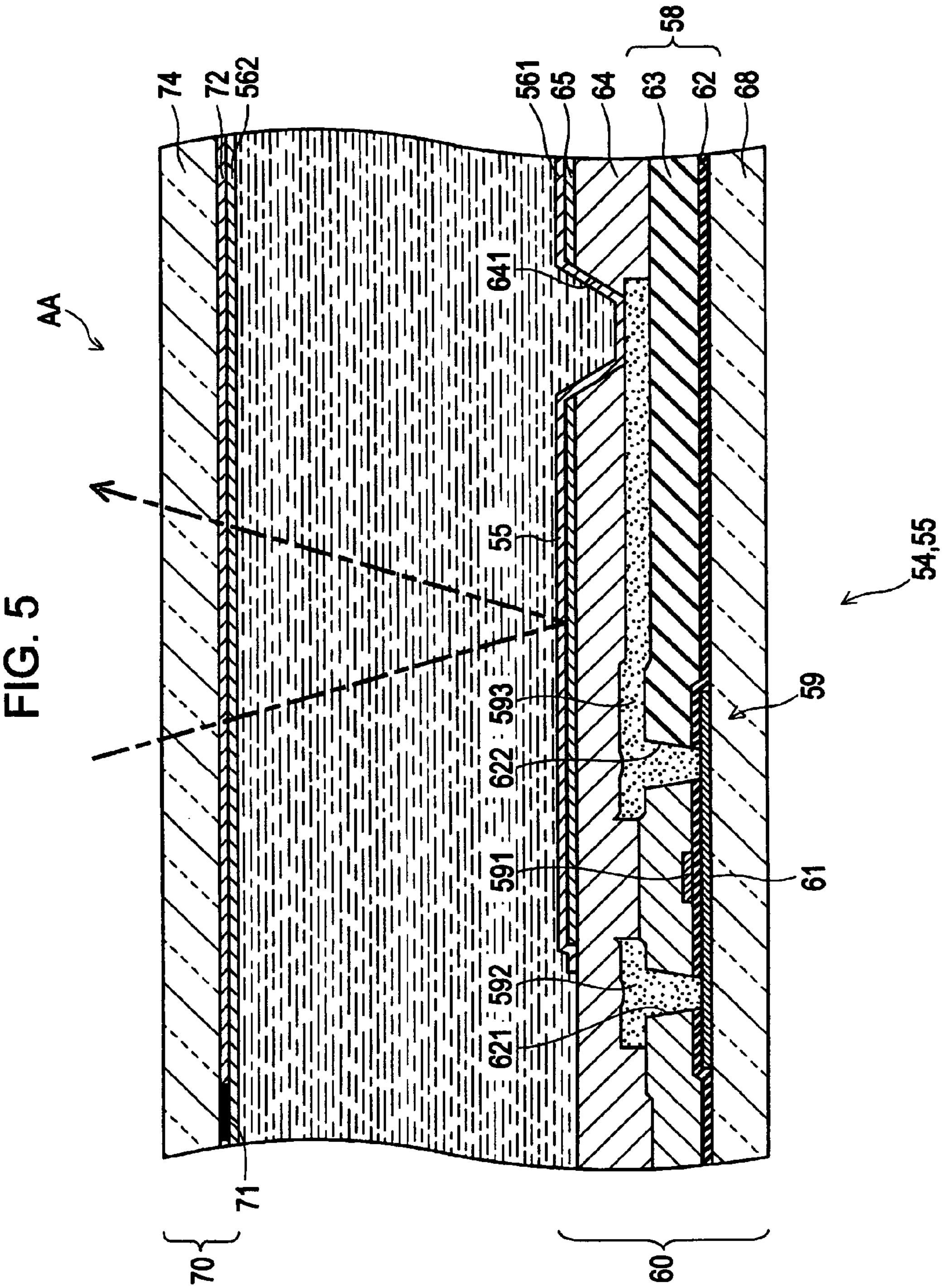
FIG. 5 is a sectional view illustrating part of the liquid crystal panel of the electro-optical device.
Figure 6:
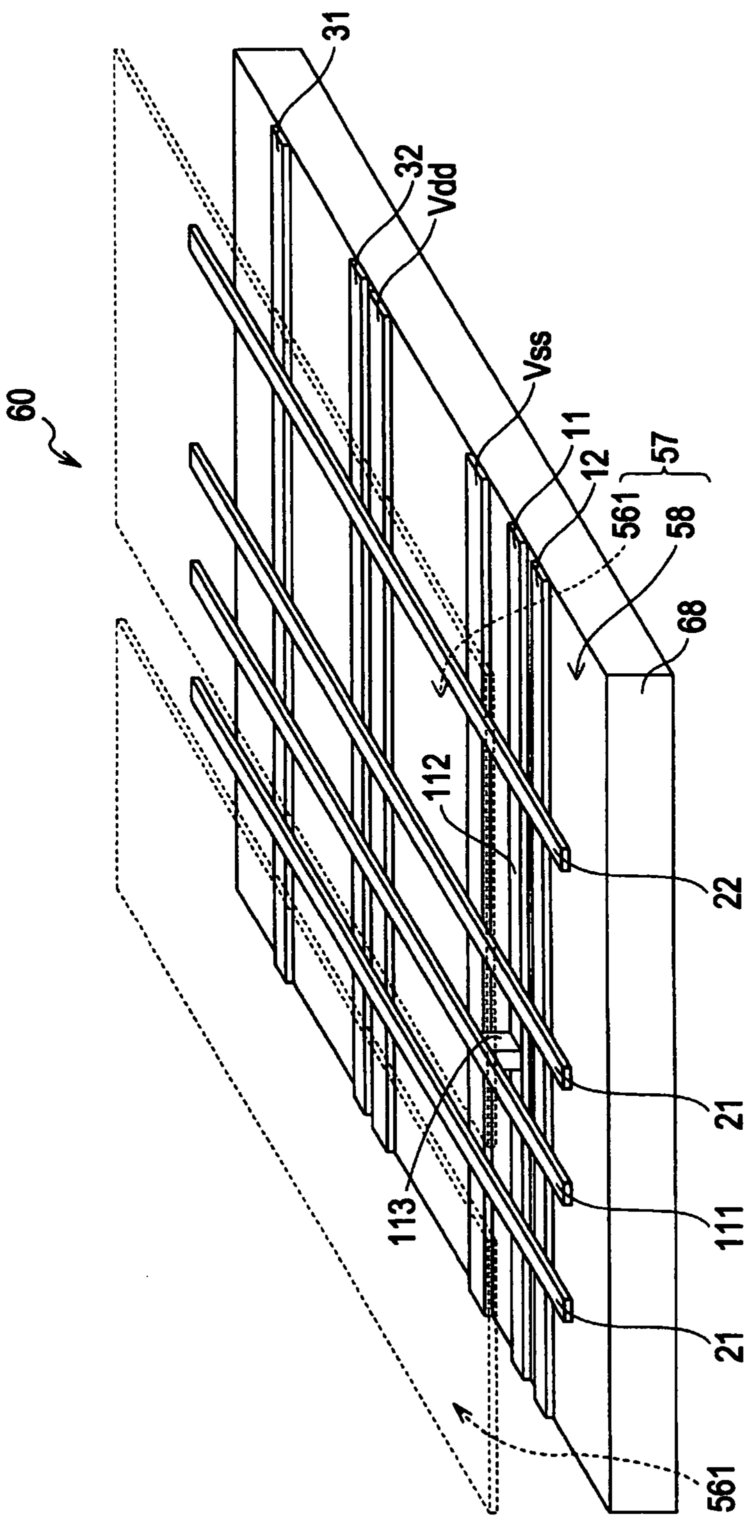
FIG. 6 is a perspective view illustrating the relationship between pixel electrodes and wiring patterns in the liquid crystal panel of the electro-optical device.

FIG. 4 is a plan view illustrating the liquid crystal panel AA. FIG. 5 is a cross sectional view illustrating part of the liquid crystal panel AA. FIG. 6 is a perspective view illustrating the relationship between the pixel electrodes and the wiring patterns in the liquid crystal panel AA. In FIG. 5, the first transfer gate 54, the second transfer gate 55, and the pixel electrode 561 are shown.

The above-described liquid crystal panel AA includes, as shown in FIG. 5, an element substrate 60 on which a plurality of pixel transistors 59, which serve as switching elements, are disposed in association with the pixels 50, a counter substrate 70 disposed opposite the element substrate 60, and liquid crystal held between the element substrate 60 and the counter substrate 70.

On the element substrate 60, as shown in FIG. 4, in addition to the address lines 11, the scanning lines 12, the first drive lines 31, and the second drive lines 32 extending in the horizontal direction in FIG. 4, high-potential power supply lines Vdd and low-potential power supply lines Vss are disposed, and pixel circuits 57 are formed in association with the pixels 50.

The pixel circuit 57 includes the plurality of pixel transistors 59 and the pixel electrode 561. The circuit elements, forming the pixel circuit 57, other than the pixel electrode 561, are hereinafter referred to as a "circuit element group 58".

That is, the circuit element group 58 includes the above-described memory cell 51, first switching circuit 52, second switching circuit 53, first transfer gate 54, and second transfer gate 55.

The circuit element groups 58 are disposed at fixed positions at the corresponding intersections between the above-described address lines 11, scanning lines 12, first drive lines 31, second drive lines 32, high-potential power supply lines Vdd, and low-potential power supply lines Vss, and the first data lines 21 and second data lines 22.

The address line 11 includes an address main line 111 extending along the first data lines 21 and the second data lines 22 and an address branch line 112 extending from the address main line 111 along the scanning lines 12.

In this embodiment, the pixel transistors 59 are planar polysilicon TFTs, and each pixel 50 includes the plurality of planar polysilicon TFTS. More specifically, the TFTs 521 and 522 forming the first switching circuit 52, the TFTs 531 and 532 forming the second switching circuit 53, the TFTs forming the inverters 511 and 512 of the memory cell 51, the TFT forming the first transfer gate 54, and the TFT forming the second transfer gate 55 are planar polysilicon TFTs.

The element substrate 60 includes a glass substrate 68, as shown in FIG. 5, and a semiconductor layer 61 composed of polycrystalline silicon (p-Si) and n+p-Si is formed in a portion on the glass substrate 68 where the TFTs are formed. A gate insulating film 62 is formed on the entire surface of the display area A corresponding to the semiconductor layer 61 and on the glass substrate 68.

A gate electrode 591 is formed on the gate insulating film 62 while facing the semiconductor layer 61. On the gate insulating film 62, in addition to the address branch lines 112 forming the address lines 11, the scanning lines 12, the first drive lines 31, and the second drive lines 32, the high-potential power supply lines Vdd and low-potential power supply lines Vss are formed. Wiring from the above-described terminals P1 and P2 is connected to the gate electrode 591 shown in FIG. 5, though it is not shown.

The gate electrodes 591, the address branch lines 112, the scanning lines 12, the first drive lines 31, the second drive lines 32, the high-potential power supply lines Vdd, the low-potential power supply lines Vss, and the gate insulating film 62 are covered with an interlayer insulating film 63.

A contact hole 621 for electrically connecting the semiconductor layer 61 to a source electrode 592, which is discussed below, and a contact hole 622 for electrically connecting the semiconductor layer 61 to a drain electrode 593, which is discussed below, are formed in the gate insulating film 62 and the interlayer insulating film 63.

The source electrode 592 and the drain electrode 593 are formed on the interlayer insulating film 63. The drain electrode 593 is extended to the position at which a contact hole 641, which is described below, is formed. On the interlayer insulting film 63, the above-described first data lines 21 and the second data lines 62 are formed. Additionally, the above-described first drive lines 31 and second drive lines 32 are connected to the source electrode 592 shown in FIG. 5, though they are not shown. The circuit element group 58 is formed as described above.

According to the above-described configuration of the element substrate 60, as shown in FIG. 6, the first data lines 21 and the second data lines 22 intersect with the above-described address branch lines 112, scanning lines 12, first drive lines 31, second drive lines 32, high-potential power supply lines Vdd, and low-potential power supply lines Vss with the interlayer insulating film 63 therebetween.

On the interlayer insulating film 63, as shown in FIGS. 5 and 6, the address main line 111 forming the address line 11 is disposed every eight columns of the circuit element groups 58. The address main line 111 and the address branch line 112 are electrically connected to each other at the intersection therebetween through a contact 113 passing through the interlayer insulating film 63. With this arrangement, each address line 11 can supply the X signal (address signal) to every four columns of the pixel circuits 57 across the address main line 111 to specify the eight columns of the pixels 50 as a portion to be selected by the scanning line 12.

A flattening film 64, which serves as an insulating film, is formed on the source electrode 592, the drain electrode 593, the first data lines 21, the second data lines 22, the address main lines 111, and the interlayer insulating film 63. In the flattening film 64, the contact hole 641 for electrically connecting the drain electrode 593 to the pixel electrode 561, which is discussed below, is formed.

On the flattening film 64, a reflective film 65 reflecting incident light is formed on the entire surface of a portion where the pixel electrodes 561 are formed, except on the portion in which the contact hole 641 is formed. The above-described pixel electrodes 561, which serve as transparent electrodes composed of indium tin oxide (ITO) or indium zinc oxide (IZO), are formed on the reflective film 65 and also on the drain electrodes 593 exposed from the contact hole 641. The pixel electrodes 561 also cover the inner surface of the contact hole 641 so that they can be electrically connected to the drain electrodes 593. An alignment film (not shown) composed of an organic film, such as a polyimide film, is formed on the pixel electrodes 561.

As described above, in the layer including the circuit element groups 58, the address main line 111 of the address line 11 is disposed every eight columns of the circuit element groups 58. Accordingly, if the width of the circuit element group 58 is indicated by a1 and if the gap between adjacent circuit element groups 58 across the address main line 111 is indicated by c, the total length of the circuit element groups 58 for eight columns results in 8(a1)+c. Each pixel electrode 561 is formed in association with the corresponding circuit element group 58. More specifically, the pixel electrodes 561 are formed directly on the circuit element groups 58 without being formed on the address main line 111 of the address line 11. Thus, the total length of the pixel electrodes 561 for eight columns also results in 8(a1)+c.

Accordingly, as shown in FIG. 4, the positions of the pixel electrodes 561 are relatively equal to the positions of the circuit element groups 58. If the length of the circuit element group 58 is a2 and the length of the pixel electrode 561 is b2, a2 is equal to b2.

The counter substrate 70 includes a glass substrate 74. A light-shielding film 71 forming a black matrix is formed on the glass substrate 74 at the position opposing the interface with the pixel electrodes 561. A color layer 72 of a color filter is formed on the glass substrate 74 and the light-shielding film 71. On the color layer 72, the counter electrodes 562 composed of a transparent conductive film, such as ITO or IZO, opposing the pixel electrodes 561 are formed. An alignment film (not shown) is formed on the counter electrodes 562.

A liquid crystal layer is disposed between the element substrate 60 and the counter substrate 70. The liquid crystal layer is sealed by a sealing material (not shown) formed around the element substrate 60 and the counter substrate 70. Retardation plates and polarizing plates (not shown) are disposed on the surfaces of the element substrate 60 and the counter substrate 70.

Figure 7:
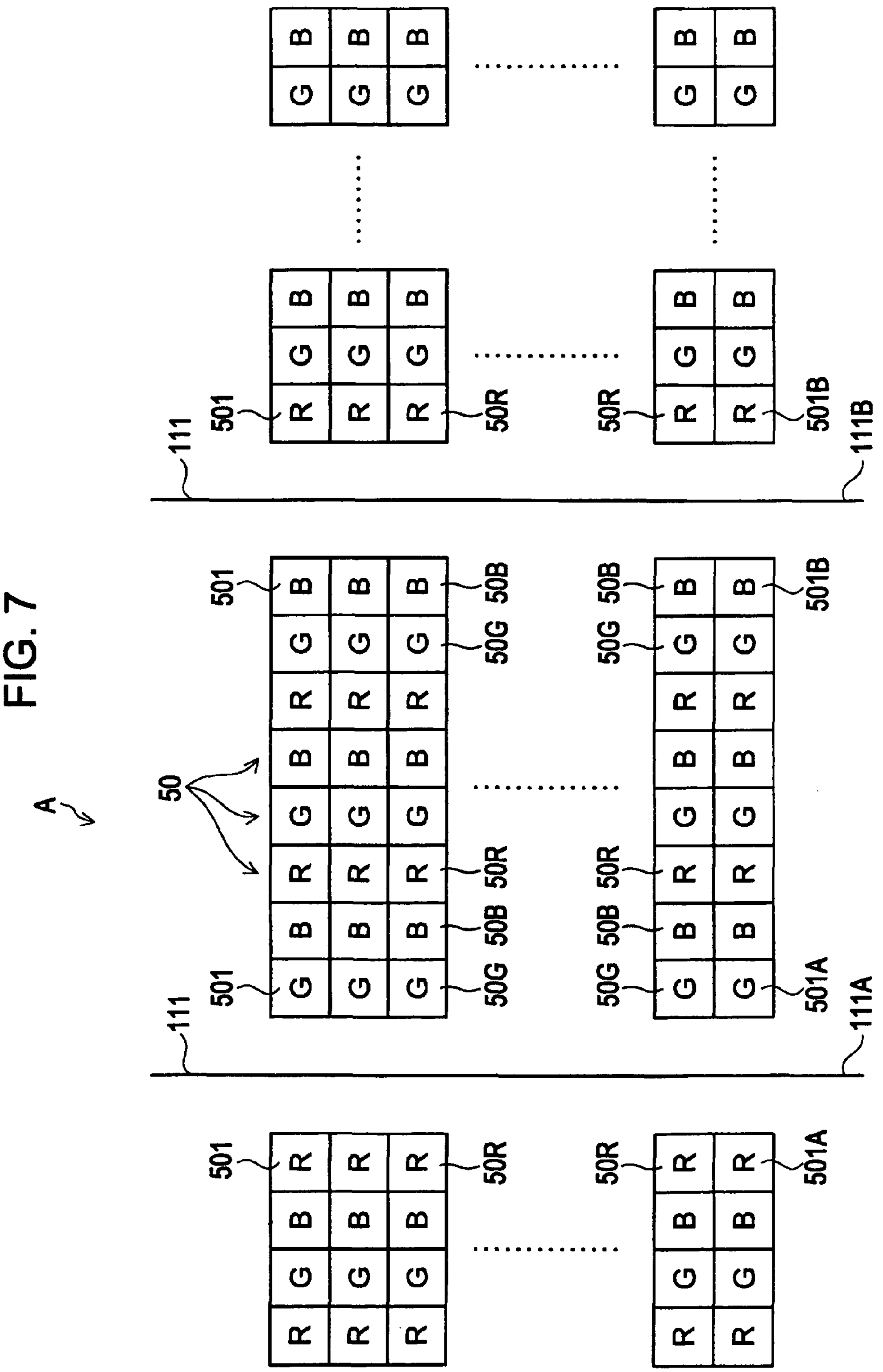
FIG. 7 is a schematic diagram illustrating a display area of the electro-optical device.

FIG. 7 is a schematic diagram illustrating the display area A. In the display area A, the plurality of pixels 50 are disposed in a matrix, and more specifically, pixels 50R having a color layer of an R color filter, pixels 50G having a color layer of a G color filter, and pixels 50B having a color layer of a B color filter are disposed in a strip-like shape in that order. The R, G, and B pixels form one picture element.

The address main line 111 is formed every eight columns of the pixels 50, and the gap between adjacent pixels 50 across the address main line 111 is larger than the gap of other adjacent pixels 50 by the width c.

It is now assumed that, among the pixels 50, pixels adjacent to each other across the address main line 111 are referred to as "specific pixel groups 501". Then, the color arrangement of the color layer 72 of the color filter of one specific pixel group 501 is different from that of the adjacent specific pixel group 501.

More specifically, among the pixels 50, the pixels adjacent to each other across an address main line 111A are the pixels 50R having the color layer of the R color filter and the pixels 50G having the color layer of the G color filter. The pixels adjacent to each other across an address main line 111B are the pixels 50B having the color layer of the B color filter and the pixels 50R having the color layer of the R color filter. Specific pixel groups 501A adjacent to each other across the address main line 111A are the pixels 50R having the color layer of the R color filter and the pixels 50G having the color layer of the G color filter. Specific pixel groups 501B adjacent to each other across the address main line 111B are the pixels 50B having the color layer of the B color filter and the pixels 50R having the color layer of the R color filter.

As described above, in the electro-optical device 1, the color types of the color layer 72 of the color filters are three, i.e., R, G, and B colors, and the number of pixels 50 disposed in the portion specified by the address main line 111 and disposed in the direction intersecting with the address main line 111 are eight.

Accordingly, the number of color types of the color layer 72 of the color filters and the number of pixels 50 disposed in the portion specified by the address main line 111 and disposed in the direction intersecting with the address main line 111 are relatively prime.

Thus, in the electro-optical device 1, the specific pixel groups 501 having the same color arrangement of the color layer 72 of the color filters appear every 24 columns of the pixels 50, in which case, 24 is the least common multiple of 3, which is the number of color types of the color layer 72 of the color filters, and 8, which is the number of pixels 50 disposed in the portion specified by the address main line 111 and disposed in the direction intersecting with the address main line 111.

The display operation of the electro-optical device 1 is as follows. The type of display performed by the electro-optical device 1 is a total reflection type. More specifically, as indicated by the arrow in FIG. 5, ambient light incident on the electro-optical device 1 from an external source is linearly polarized on the polarizing plate (not shown) of the counter substrate 70 and is then incident on the liquid crystal layer after passing through the glass substrate 74, the color layer 72 of the color filters, and the counter electrodes 562. The light incident on the liquid crystal layer passes through the pixel electrodes 561 and is reflected by the reflective film 65, and again passes through the liquid crystal layer through the pixel electrodes 561. While passing through the liquid crystal layer, the polarizing direction of the light is rotated in accordance with the applied voltage. The light passing through the liquid crystal layer again passes through the counter electrodes 562, the color layer 72 of the color filters, and the glass substrate 74 to reach the polarizing plate of the counter substrate 70. After reaching the polarizing plate, the light passes through the polarizing plate in accordance with the amount by which the polarizing direction is rotated because of the liquid crystal.

In the total-reflection electro-optical device 1, the pixel electrodes 561 can be formed on the circuitry including the memory cell 61, the first and second switching circuits 52 and 53, and the first and second transfer gates 54 and 55. Accordingly, the effective area of the pixel electrodes 561 can be sufficiently and amply ensured without being influenced by the area occupied by the memory cell 51 and the wiring therefor. Additionally, since a light source, such as backlight, is not necessary, high-luminance display can be implemented with low power consumption.

According to the above-described embodiment of the invention, the following advantages are achieved.

The address line 11 specifying a portion to be selected by the scanning line 12 is formed of the address main line 111 and the address branch line 112. Accordingly, a portion of a display image to be changed can be specified by the address line 11, thereby implementing power saving.

The number of color types of the color layer 72 of the color filters is 3, and the number of pixels disposed in a portion specified by the address main line 111 and disposed in the direction intersecting with the address main line 111 is 8, and 3 and 8 are relatively prime. Accordingly, the specific pixel groups 501 having the same color arrangement of the color layer 72 of the color filters appear every 24 columns of the pixels 50, and thus, the appearance cycle becomes long. Accordingly, it is possible to suppress the concentration of specific types of pixels in a display image. As a result, the appearance of special stripe or spot-like patterns can be suppressed, and the image quality can be improved.

MODIFIED EXAMPLES

The invention is not restricted to the aforementioned embodiment, and modifications and improvements may be made within the scope of the invention.

For example, in the aforementioned embodiment, the electro-optical device 1 performs total-reflection-type display. Alternatively, the electro-optical device 1 may perform transmissive-type display or transflective-type display.

The plurality of pixels 50 include the pixels 50R having the color layer of the R color filter, the pixels 50G having the color layer of the G color filter, and the pixels 50B having the color layer of the B color filter. However, the pixels 50 are not restricted to those three types of colors.

Although the number of types of the pixels 50 is three, the pixels 50 may be formed of a different number of types of pixels. For example, the pixels 50 may have six types of pixels.

Although the three types of pixels 50 are arranged in a stripe pattern, it may be arranged in a different pattern, such as a mosaic or delta pattern.

In the foregoing embodiment, the address main line 111 is disposed every eight columns of the pixels 50. However, the address main line 111 may be disposed every different number of columns of the pixels 50, for example, every seven or ten columns of the pixels 50.

As the liquid crystal that can be used in the electro-optical device, a twisted nematic (TN) liquid crystal or a super twisted nematic (STN) liquid crystal may be used. In the foregoing embodiment, the electro-optical device using liquid crystal as the electro-optical material has been discussed by way of example. However, the invention may be applied to electro-optical devices using electro-optical materials other than liquid crystal. Such electro-optical devices include electrophoretic display panels using, as the electro-optical material, a microcapsule containing a colored liquid and white particles dispersed in the colored liquid, twist ball display panels using, as the electro-optical material, a twist ball that is painted into different colors according to the areas having different polarities, toner display panels using a black toner color as the electro-optical material, and plasma display panels using a high-pressure gas, such as helium or neon, as the electro-optical material.

In the foregoing embodiment, although polysilicon TFTs are used as the pixel transistors 59, different types of TFTs, for example, amorphous silicon TFTs, may be used.

APPLIED EXAMPLES

Figure 8:
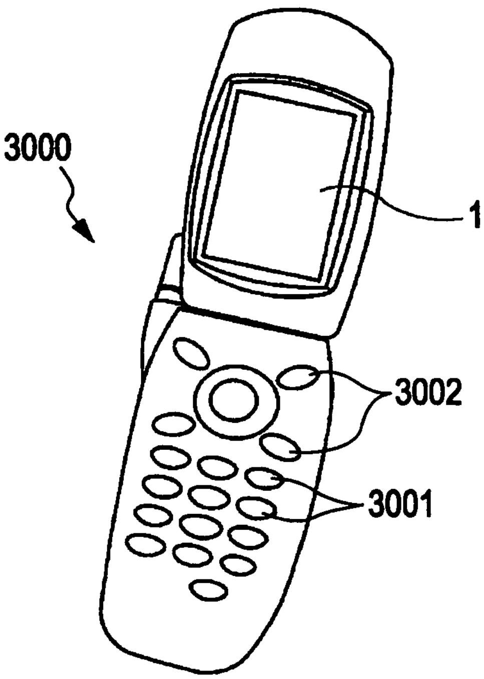
FIG. 8 is a perspective view illustrating the configuration of a cellular telephone including the above-described electro-optical device.

Electronic apparatuses including the electro-optical device 1 of the above-described embodiment are described below. FIG. 8 is a perspective view illustrating the configuration of a cellular telephone 3000 using the electro-optical device 1. The cellular telephone 3000 includes a plurality of operation buttons 3001, scroll buttons 3002, and the electro-optical device 1. The scroll buttons 3002 can be operated to scroll the screen displayed on the electro-optical device 1.

The electronic apparatuses using the electro-optical device 1 include, not only the cellular telephone 3000 shown in FIG. 8, but also other electronic apparatuses, such as personal computers, information portable terminals, digital still cameras, liquid crystal televisions, view-finder-type or monitor-direct-view-type video recorders, car navigation systems, pagers, digital diaries, calculators, word-processors, workstations, videophones, point-of-sale (POS) terminals, and devices provided with touch panels. The above-described electro-optical devices 1 can be used as the display units of those electronic apparatuses.

The entire disclosure of Japanese Patent Application No. 2005-281398, filed Sep. 28, 2005 is expressly incorporated by reference herein.

What is claimed is:

1. An electro-optical device comprising:

a plurality of scanning lines supplied with a scanning signal;

a plurality of data lines intersecting with the corresponding plurality of scanning lines;

a plurality of pixels disposed at intersections of the corresponding plurality of scanning lines and the corresponding plurality of data lines, the plurality of pixels including a plurality of types of color filters; and a plurality of address lines each supplied with an address signal that specifies a portion of a display area, the specified portion being selected by the corresponding scanning line, a length and a width of the specified portion being less than a length and a width of the display area, wherein each address line includes an address main line extending along the data lines and formed every N columns of pixels along the scanning lines, and an address branch line extending along the scanning lines and electrically connected to the address main line, wherein:

for each column of pixels, pixels in a same column include a same type of color filter;

for each address main line, columns of pixels adjacent to each other across the address main line are set to be specific pixel groups;

a color arrangement of the color filters of a first specific pixel group is different from a color arrangement of the color filters of a second specific pixel group adjacent to the first specific pixel group;

N is a positive integer greater than 1 and other than a multiple of the number of types of color filters such that for the plurality of address main lines a number of color combinations of the color filter groups of the first and second specific pixel groups adjacent to each other across the address main line is the same as the number of types of color filters; and a gap between adjacent pixels across the address main line is larger than a gap between other adjacent pixels.

2. The electro-optical device according to claim 1, wherein the number of the types of the color filters and the number of pixels disposed in a portion specified by the address line and disposed in a direction intersecting with the address line are relatively prime.

3. An electronic apparatus including the electro-optical device set forth in claim 1.

4. The electro-optical device according to claim 1, wherein the number of the types of color filters is 3, and the number of pixels disposed in a portion specified by the address line and disposed in a direction intersecting with the address line is 8.

5. The electro-optical device according to claim 4, wherein the first specific pixel group only appears every 24 columns of pixels.

6. The electro-optical device according to claim 1, wherein each address main line is formed at every eight columns of pixels.

7. The electro-optical device according to claim 1, wherein the display area includes a plurality of address main lines.

8. The electro-optical device according to claim 1, wherein the first specific pixel group only appears every X columns of pixels, wherein X is equal to the number of types of color filters multiplied by N.

9. The electro-optical device according to claim 1, wherein the color arrangement of the color filters of the first specific pixel group includes i) a column of pixels each having a first type of color filter and ii) a column of pixels each having a second type of color filter, and wherein the color arrangement of the color filters of the second specific pixel group, adjacent to the first specific pixel group, includes i) a column of pixels each having the second type of color filter and ii) a column of pixels each having a third type of color filter.

10. An electro-optical device comprising:

a plurality of scanning lines;

a plurality of data lines intersecting with the corresponding plurality of scanning lines;

a plurality of pixels disposed at intersections of the corresponding plurality of scanning lines and the corresponding plurality of data lines, each of the plurality of pixels including a plurality of types of color filters; and a plurality of address lines that each specify a portion to be selected by the corresponding scanning line, a length and a width of the specified portion being less than a length and a width of the display area, wherein each address line includes an address main line extending along the data lines and formed every N columns of color filters along the scanning lines, and an address branch line extending along the scanning lines and electrically connected to the address main line, wherein:

for each column of color filters, color filters in a same column are a same type of color filter;

for each address main line, columns of pixels adjacent to each other across the address main line are set to be specific pixel groups;

a color arrangement of the color filters of a first specific pixel group is different from a color arrangement of the color filters of a second specific pixel group adjacent to the first specific pixel group;

N is a positive integer greater than 1 and not equal to a multiple of the number of types of color filters that each of the plurality of pixels includes such that for the plurality of address main lines a number of color combinations of the color filter groups of the first and second specific pixel groups adjacent to each other across the address main line is the same as the number of types of color filters; and a gap between adjacent pixels across the address main line is larger than a gap between other adjacent pixels.

11. The electro-optical device according to claim 10, wherein the number of the types of the color filters and N are relatively prime.

12. An electronic apparatus including the electro-optical device set forth in claim 10.

13. The electro-optical device according to claim 10, wherein the display area includes a plurality of address main lines.

* * * * *